United States Patent [19]

Yagi

[11] Patent Number: 5,038,354
[45] Date of Patent: Aug. 6, 1991

[54] SEMICONDUCTOR LIGHT EMITTING, LIGHT CONCENTRATING DEVICE

[75] Inventor: Tetsuya Yagi, Itami, Japan

[73] Assignee: Mitsubishi Denki Kabushiki Kaisha, Tokyo, Japan

[21] Appl. No.: 886,094

[22] Filed: Jul. 16, 1986

[30] Foreign Application Priority Data

Jul. 16, 1985 [JP] Japan .................. 60-159055

[51] Int. Cl.[5] ......................... H01S 3/025
[52] U.S. Cl. ....................... 372/44; 357/17
[58] Field of Search ............ 372/44; 357/17, 30, 357/19; 250/211 J

[56] References Cited

U.S. PATENT DOCUMENTS 3,649,837  3/1972  Lehovec ............... 350/162.16
3,668,404  6/1972  Lehovec ............... 250/211 J
4,605,943  8/1986  Nakamura et al. ......... 357/17

FOREIGN PATENT DOCUMENTS 1193228  5/1970  United Kingdom .
2005471A  4/1979  United Kingdom .

OTHER PUBLICATIONS

GaInAsP/InP Fast, High-Radiance, 1.05–1.3 μm Wavelength LED's with Efficient Lens Coupling to Small Numerical Aperture Silica Optical Fibers, Goodfellow et al., IEEE Transactions on Electron Devices, vol. ED-26, No. 8, Aug. 1979.

Examiner's Report to the Comptroller Under Section 17(5), application No. 8617210.

Primary Examiner—Frank Gonzalez

[57] ABSTRACT

A semiconductor light emitting light concentrating device is described which has a multiple diffraction ring for collecting and concentrating the light emitted from an LED integrally formed into the electrode at the semiconductor substrate end of the light emitting device.

9 Claims, 4 Drawing Sheets

F I G .5.
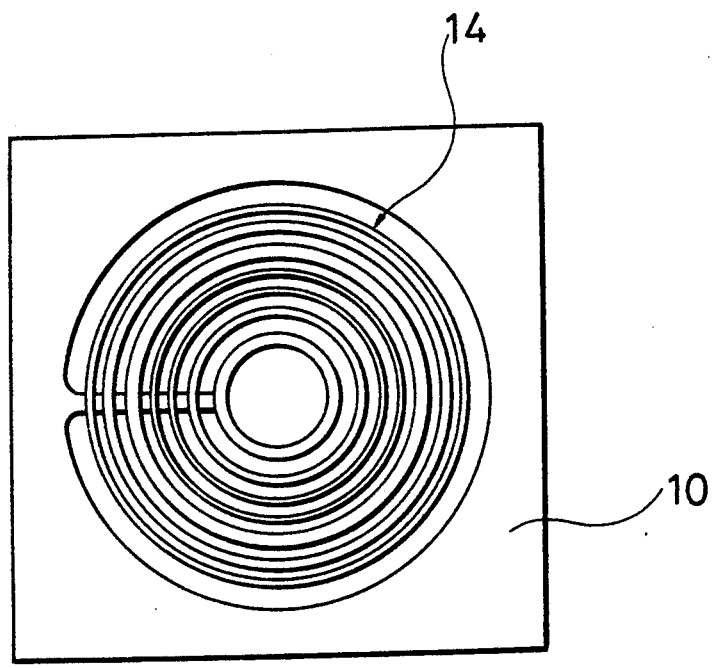

SEMICONDUCTOR LIGHT EMITTING, LIGHT CONCENTRATING DEVICE

FIELD OF THE INVENTION

The present invention relates to a semiconductor light emitting light concentrating device, and especially to a light emitting diode (hereinafter referred to as "LED") with an attached lens produced by a fine-patterning process.

BACKGROUND OF THE INVENTION

FIG. 1 shows a prior art semiconductor light emitting device. The reference numeral 1 designates a semiconductor light emitting element which is constituted by epitaxial growth layers comprising a p type indium-phosphorus (hereinafter referred to as "p-InP") semiconductor substrate 2, a p-InP buffer layer 3, a p type indium-gallium-arsenic-phosphorus (hereinafter referred to as "p-InGaAsP") semiconductor clad layer 4, a p-InGaAsP active layer 5, an n-InGaAsP clad layer 6, an n type indium-gallium-arsenic (hereinafter referred to as "n-InGaAs") semiconductor contact layer 7, an insulating layer 8 such as silicon dioxide ($SiO_2$), and electrodes 9 and 10. In such a semiconductor element 1, a light emitting region 11 which conducts a light emission is produced at the center portion of the active layer 5. The reference numeral 12 designates a sphere lens for collecting the light from the semiconductor light emitting element 1. The reference numeral 13 designates an adhesive for fixing the sphere lens 12 onto the semiconductor light emitting element 1.

In this prior art semiconductor light emitting device with such a construction when a current is injected thereinto from the electrodes 9 and 10 light is isotropically radiated from the light emitting region 11 of the active layer 5, and it is guided to the outside, collected by the sphere lens 12 attached to the substrate 2. In this semiconductor light emitting device the conductivity types of the substrate 2 and the epitaxial layers 3 to 7 and the energy band gap thereof are selected such that a current is concentrated on the light emission region 11, that the recombinations of the electron hole pairs occur thereat concentrately, and that the light generated at the regions from the light emitting region 11 to the sphere lens 12 can sufficiently penetrate those layers.

In this prior art semiconductor light emitting device, however, there is a problem that a skill is required for fixing the sphere lens 12 onto the substrate 2 by the adhesive 13 without soiling the portions other than the required portion by the adhesive 13.

SUMMARY OF THE INVENTION

An object of the present invention is to provide an improved semiconductor light emitting light concentrating device which can be produced easily.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor light emitting light concentrating device comprising: a semiconductor light emitting element; and a light collection multiple diffraction ring for collecting the light emitted from said semiconductor light emitting element.

BRIEF DESCRIPTION OF THE DRAWINGS

FIG. 5 is a plan view showing another example of the light collection multiple diffraction lens 14 of the device of FIG. 2.

DETAILED DESCRIPTION OF THE PREFERRED EMBODIMENTS

Figure 1:
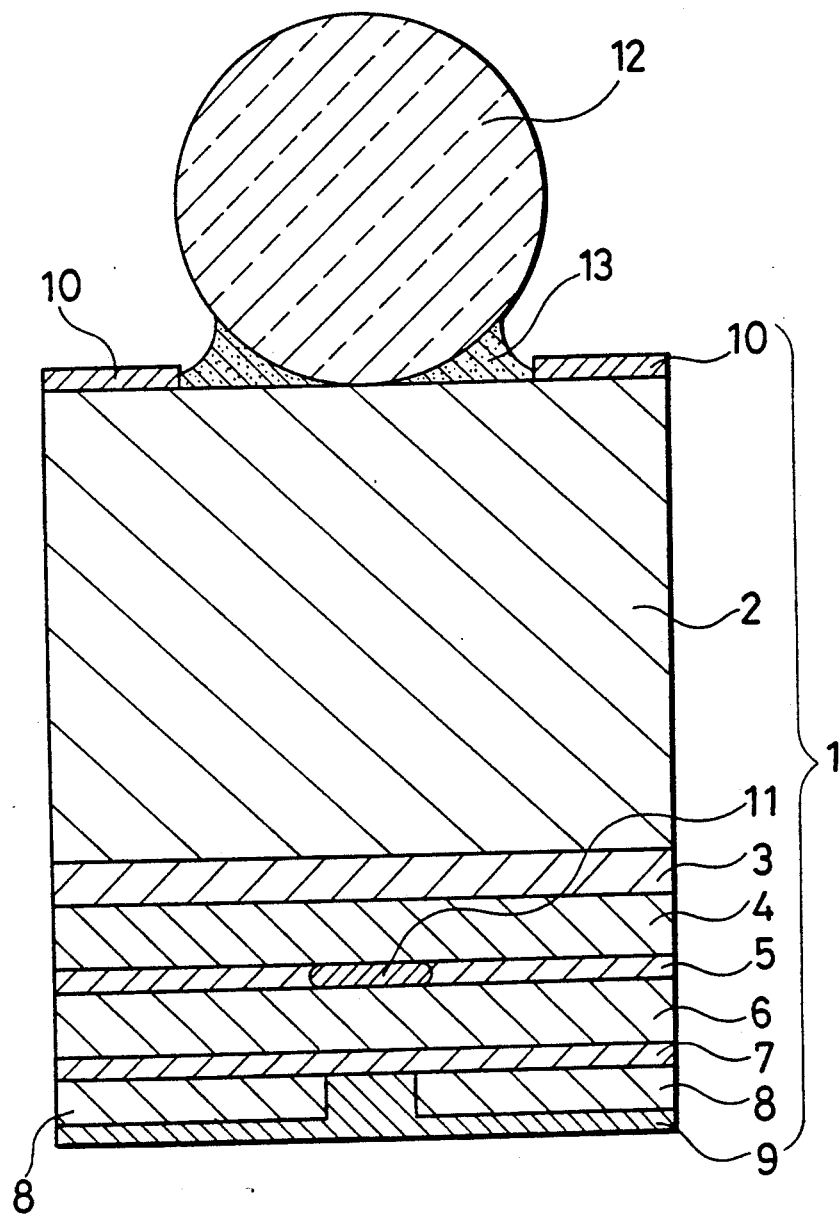
FIG. 1 is a cross-sectional view showing the prior art semiconductor light emitting device.
Figure 2:
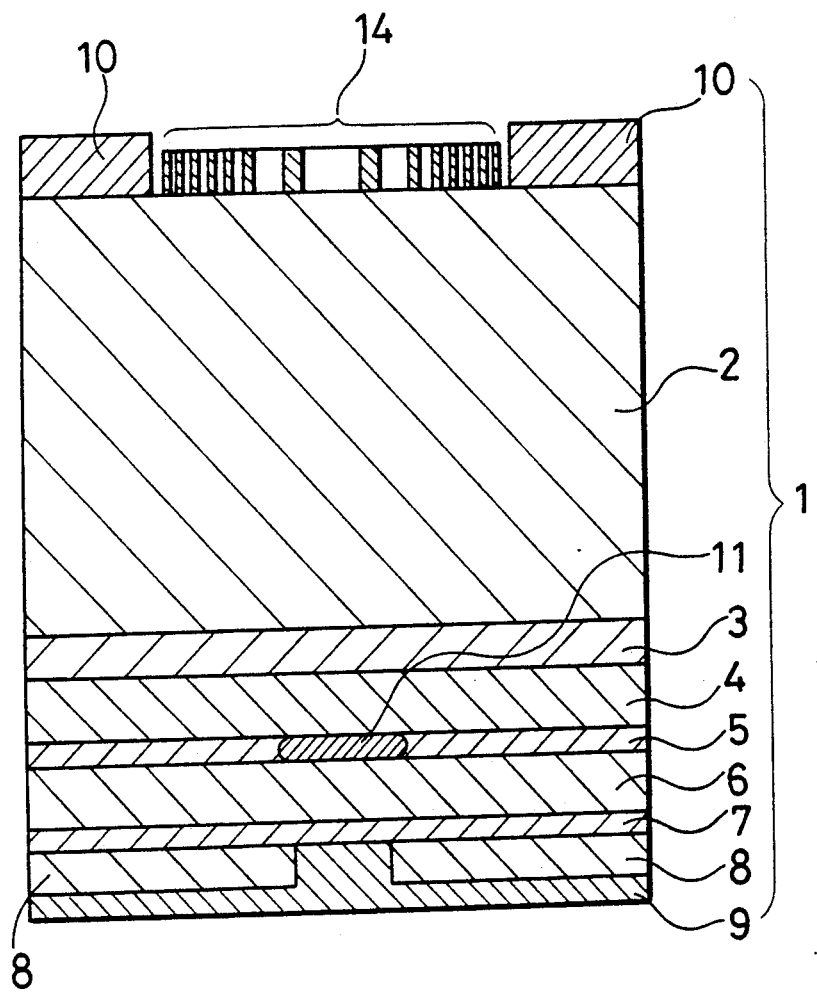
FIG. 2 is a cross-sectional view showing a semiconductor light emitting device as a first embodiment of the present invention.

FIG. 2 shows a first embodiment of the present invention. The same reference numerals are used to designate the same or corresponding elements as those shown in FIG. 1. The reference numeral 14 designates a light collection multiple diffraction ring which, provided integrally with the semiconductor light emission element 1, effectively functions as a lens utilizing the diffraction phenomenon of the light. This multiple diffraction ring 14 is produced by growing a p-InGaAs epitaxial layer which has a narrower energy band gap than that of the active layer 5 and does not make the light penetrate, and removing unrequired portions by a fine-patterning process.

Figure 3:
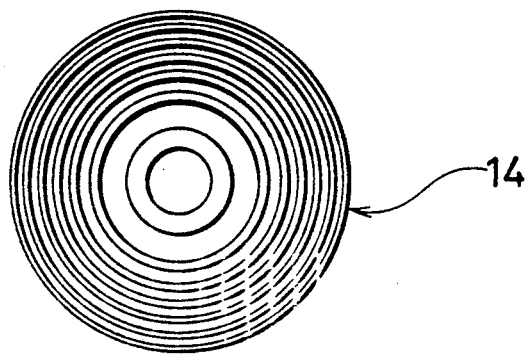
FIG. 3 is a plan view showing the light collection multiple diffraction lens 14 of the device of FIG. 2.

FIG. 3 shows a plan view of this light collection multiple diffraction ring 14. The radius and the width of each ring is determined by the wavelength of the light to be generated and the distances between that and the light sourse and between that and the expected position at which the light is to be collected. This can be produced by the reduction of the original drawing as in producing usual masks, or by a method of approximately making a pattern using a Newton ring which utilizes a light interference.

This embodiment with such a construction where the sphere lens 12 in the prior art device is replaced by the light collection multiple diffraction ring 14 operates similarly as the prior art device because the multiple diffraction ring 14 has a light collection ability equal to that of the sphere lens 12. Furthermore, the device requires no work and no skill for fixing the lens because the multiple diffraction ring 14 is produced by growing an epitaxial layer on the rear surface of the semiconductor substrate 2 of the semiconductor light emission element 1.

Figure 4:
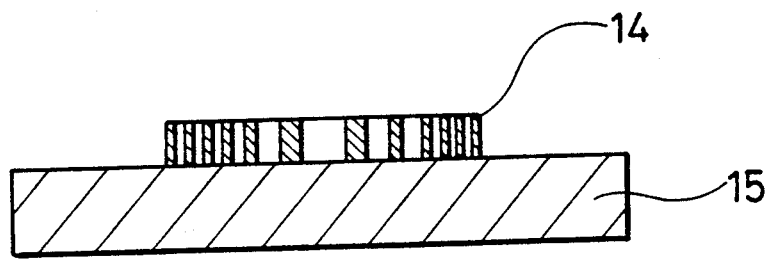
FIG. 4 is a cross-sectional view showing a semiconductor light emitting device as a second embodiment of the present invention.
Figure 4:
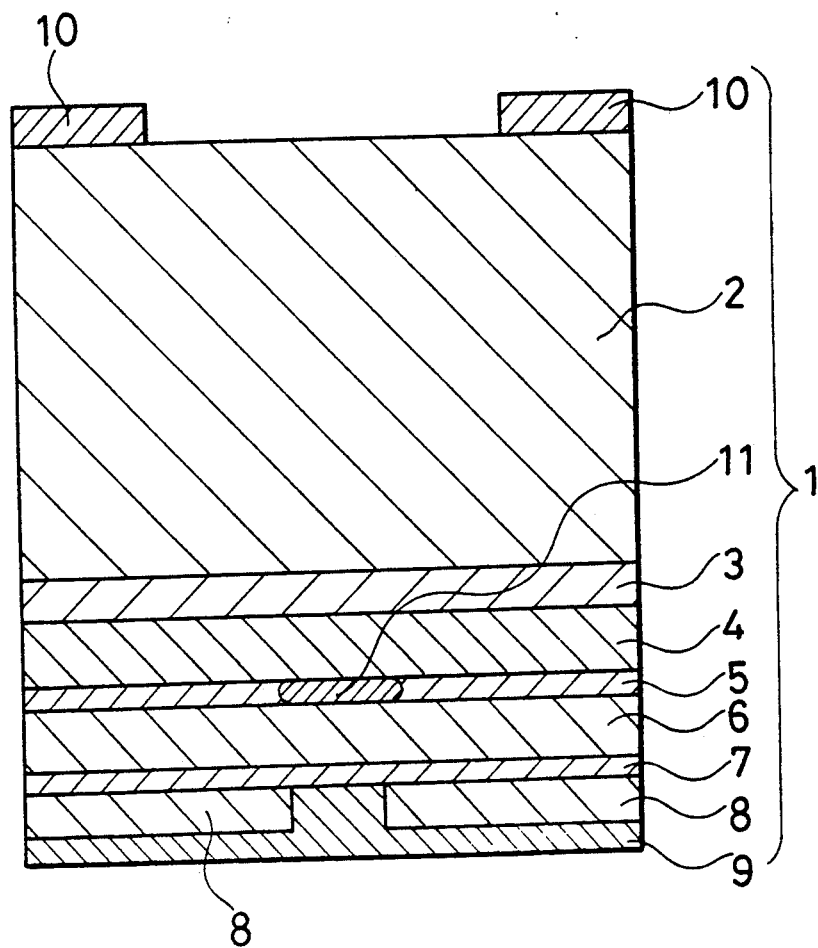

In the above-illustrated embodiment, the light collection multiple diffraction ring 14 is provided integrally with the semiconductor light emission element 1, but this ring 14 may be produced on the main surface of a transparent substrate 15 and fixed at a position apart from the semiconductor light emission element 1 as shown in FIG. 4.

In the above-illustrated embodiment, the light collection multiple diffraction ring 14 is constituted by an epitaxial layer, but this ring may be constituted by a metal which, provided at the rear surface of the semiconductor substrate 2, also functions as an electrode 10 of the semiconductor light emission element 1. In this case the production of the electrode 10 and the light collection multiple diffraction ring 14 can be conducted at the same process, thereby reducing the production process. Besides, the light collection multiple diffraction ring 14 may not also function as an electrode 10, but may be only required to be made of the same metal as that of the electrode 10 for the purpose of reducing the production process. Furthermore, the light collection multiple diffraction ring 14 may comprise any non-light transparent material other than an epitaxial layer or a metal. For example, the ring may be produced by ion injecting impurities deeply into the semiconductor substrate 2 so as to produce recombination centers of high density in a multiple ring shape.

Furthermore, in the illustrated embodiment the light collection multiple diffraction ring 14 is provided at the rear surface of the semiconductor light emission element 1, but ring 14 may be provided at any position because the light is irradiated isotropically from the light emission region 11.

In the illustrated embodiment, the light collection multiple diffraction ring 14 is produced to have concentric circles whose diameters can be determined by calculation, but even a ring having circles deviated from concentric circles and diameters deviated from calculated values is expected to have a light collection function of some degree corresponding to the degrees of the deviations.

In the illustrated embodiment InP, InGaAsP, InGaAs series semiconductor light emission devices are described, but the present invention can be also applied to GaAs or GaAlAs series semiconductor light emission device.

Furthermore, it is desirable that the distance between the light emission region 11 and the light collection multiple diffraction ring 14 should be larger than the limitation in the fine-patterning process of the multiple diffraction ring. The alteration of FIG. 4 is advantageous in view of this point because the distance can be freely selected.

FIG. 5 illustrates an alternate form of the diffraction lens 14 which can be used in this invention.

As is evident from the foregoing description, according to the present invention, a light collection multiple diffraction ring is used instead of the sphere lens of the prior art device. The light emitting, light concentrating device of this invention can be easily produced by a fine-patterning process without need for great skill.

What is claimed is:

1. A semiconductor light emitting and light concentrating device comprising:
   a semiconductor light emitting element having a front surface and a rear surface opposite from said front surface; and
   a light collecting multiple diffraction ring system for collecting and focusing the light emitted from said semiconductor light emitting element, wherein said light collecting multiple diffraction ring comprises a metal layer fixed to and integral with a first portion of said rear surface of said semiconductor light emitting element, said metal layer also being capable of functioning as an electrode of said semiconductor light emitting element.

2. A semiconductor light emitting and light concentrating device according to claim 1, comprising:
   a semiconductor substrate having a second surface that forms said rear surface of said semiconductor light emitting element;
   a plurality of epitaxial layers including a light emitting region laminated on a first surface of said semiconductor substrate opposite from said second surface, wherein said plurality of epitaxial layers including the light emitting region comprises a buffer layer formed on said first surface of said semiconductor substrate, a first clad layer formed on said buffer layer, an active layer formed on said first clad layer having said light emitting region provided at substantially a central portion of said active layer, a second clad layer formed on said active layer, a contact layer formed on said second layer and an insulating layer formed on said contact layer that forms said first surface, wherein an energy band gap of said light collecting multiple diffraction ring is narrower than an energy band gap of said active layer;
   a first electrode affixed to said insulating layer; and
   a second electrode fixed to a remainder of said first portion of the rear surface of said semiconductor light emitting element.

3. The semiconductor light emitting and light concentrating device of claim 1, wherein said semiconductor light emitting element comprises a plurality of epitaxial layers formed from at least one member of the group consisting of InP, InGaAsP, InGaAs, and GaAlAs.

4. The semiconductor light emitting and light concentrating device of claim 2, wherein said semiconductor light emitting element comprises a plurality of epitaxial layers formed from at least one member of the group consisting of InP, InGaAsP, InGaAs, GaAs, GaAlAs.

5. The semiconductor light emitting and light concentrating device of claim 2, wherein said semiconductor substrate and said buffer layer comprise InP, said first clad layer, said active layer, and said second clad layer comprise InGaAsP; said contact layer comprises InGaAs; and said insulating layer comprises silicon dioxide.

6. A semiconductor light emitting and light concentrating device comprising:
   a semiconductor light emitting element having a front surface and a rear surface opposite from said front surface; and
   a light collecting multiple diffraction ring system for collecting and focusing the light emitted from said semiconductor light emitting element, wherein said light collecting multiple diffraction ring comprises an epitaxial layer formed on a transparent substrate surface, said diffraction ring being operatively associated with, but physically apart from said rear surface of said semiconductor light emitting element.

7. The semiconductor light emitting and light concentrating device of claim 6, comprising:
   a semiconductor substrate having a second surface that forms said rear surface of said semiconductor light emitting element;
   a plurality of epitaxial layers including a light emitting region laminated on a first surface of said semiconductor substrate opposite from said second surface, wherein said plurality of epitaxial layers including the light emitting region comprises a buffer layer formed on said first surface of said semiconductor substrate, a first clad layer formed on said buffer layer, an active layer formed on said first clad layer having said light emitting region provided at substantially a center portion of said active layer, a second clad layer formed on said active layer, a contact layer formed on said second clad layer and an insulating layer formed on said contact layer that forms said front surface, wherein an energy band gap of said light collecting multiple diffraction ring is narrower than an energy band gap of said active layer;

a first electrode affixed to said insulating layer; and a second electrode fixed to the rear surface of said semiconductor light emitting element.

8. The semiconductor light emitting and light concentrating device of claim 7, wherein said semiconductor substrate and said buffer layer comprise InP, said first clad layer, said active layer, and said second clad layer comprise InGaAsP; said contact layer comprises InGaAs; and said insulating layer comprises silicon dioxide.

9. A combined light emitting and light concentrating device product formed by a method comprising:

depositing a plurality of epitaxial layers including a light emitting region on a first surface of a semiconductor substrate wherein a second surface of said substrate opposite from said first surface constitutes a rear surface of said device and a top surface of said plurality of layers opposite from said rear surface constitutes an upper surface of said epitaxial layers;

depositing a first metal electrode onto a first area of said rear surface;

depositing a second metal electrode onto said upper surface; and forming integrally on a second area of said rear surface, a light collecting multiple diffraction ring for collecting and focusing the light emitted from said light region.

* * * * *